(12) United States Patent
Nakano

(10) Patent No.: US 6,292,497 B1
(45) Date of Patent: *Sep. 18, 2001

(54) LASER DIODE DRIVING METHOD AND CIRCUIT

(75) Inventor: Masayuki Nakano, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/179,561

(22) Filed: Oct. 27, 1998

(30) Foreign Application Priority Data

Oct. 28, 1997 (JP) .................................... 9-295746

(51) Int. Cl.[7] .................................................. H01S 3/13
(52) U.S. Cl. ................................... 372/29.015; 372/38.02
(58) Field of Search ........................... 372/29.015, 38.02

(56) References Cited

U.S. PATENT DOCUMENTS

| 4,797,799 | * | 1/1989 | Inokuchi | 363/37 |
| 5,526,164 | * | 6/1996 | Link | 359/187 |
| 5,812,572 | * | 9/1998 | King | 372/38 |
| 6,055,252 | * | 4/2000 | Zhang | 372/34 |

FOREIGN PATENT DOCUMENTS

| 59-112670 | 6/1984 | (JP) . |
| 60-251731 | 12/1985 | (JP) . |
| 2-308584 | 12/1990 | (JP) . |
| 3-56871 | 3/1991 | (JP) . |

* cited by examiner

Primary Examiner—Teresa M. Arroyo
Assistant Examiner—Gioacchino Inzirillo
(74) Attorney, Agent, or Firm—McGuireWoods LLP

(57) ABSTRACT

In a laser diode driving method, a bias current set about the light emission threshold current of a laser diode, and a pulse current for causing the laser diode to emit light are adjusted in accordance with the ambient temperature. The laser diode is driven by a current prepared by superposing the bias current and the pulse current, thereby controlling the optical output and extinction ratio of the laser diode at a constant level. A laser diode driving circuit is also disclosed.

14 Claims, 5 Drawing Sheets

LASER DIODE DRIVING METHOD AND CIRCUIT

BACKGROUND OF THE INVENTION

The present invention relates to a laser diode driving method and circuit for controlling an optical output and extinction ratio at a constant level in correspondence with deterioration of the laser diode with time.

An example of a laser diode driving circuit used in an optical transmission system or the like is disclosed in Japanese Patent Laid-Open No. 2-308584 in which the optical output from the laser diode is controlled at a constant level regardless of the ambient temperature.

FIG. 5 shows the arrangement of a conventional laser diode driving circuit for controlling the optical output from the laser diode.

A laser diode LD is driven by a current prepared by superposing a driving current Id and a bias current Is. The driving current Id is a pulse current based on transmission data, whereas the bias current Is is a base current for causing the LD to emit light by induced emission. A temperature sensor 110 generates a voltage corresponding to the ambient temperature and outputs the voltage as an analog temperature signal representing the ambient temperature to an A/D converter 120. The A/D converter 120 converts the input temperature signal into a digital signal and outputs the digital signal to a memory 150.

The memory 150 uses input digital signal as an address signal to read out digital data stored at the corresponding address from the memory 150 and output the data to a D/A converter 130. The D/A converter 130 converts the input digital data into an analog signal and outputs the analog signal to a current controller 140. The current controller 140 controls an emitter current Is common to transistors Q1 and Q2 in accordance with the analog signal from the D/A converter 130.

The operation of the laser diode driving circuit will be described.

A pre-bias signal is applied to the base of the transistor Q1. Assume that the state in which the pre-bias signal voltage is higher than a reference voltage (−VR) is a disable state. In the disable state, the transistor Q1 is turned on, the transistor Q2 is turned off, and the laser diode LD is not driven. Assume that the state in which the pre-bias signal voltage is lower than the reference voltage (−VR) is an enable state. In the enable state, the transistor Q1 is turned off, the transistor Q2 is turned on, and the laser diode LD is driven by a current, i.e., a current which changes between Is and Is+Id, prepared by superposing the driving current Id and the bias current Is generated by the current controller 140.

In the memory 150, data about the bias current corresponding to the ambient temperature is stored. When data obtained by digitally converting a temperature signal representing the ambient temperature is input from the A/D converter 120 to the address line of the memory 150, the memory 150 outputs data about the bias current corresponding to the ambient temperature to the data line.

The D/A converter 130 D/A-converts the bias current data output to the data line, and outputs the analog signal to the current controller 140. The current controller 140 controls the emitter current of the transistors Q1 and Q2 in accordance with the analog signal output from the D/A converter 130.

In the laser diode driving circuit, the emitter current Is is adjusted in correspondence with the ambient temperature. That is, when the ambient temperature changes, data on the address line changes, and data about a new bias current appears on the data line. The D/A converter 130 D/A-converts the data on the data line, and the current controller 140 converts the signal output from the D/A converter 130 into a current.

At this time, if the pre-bias signal changes to the enable state, the laser diode LD is driven by a current prepared by superposing the driving current Id on the new bias current Is adjusted in correspondence with the ambient temperature.

The laser diode driving circuit employs a feed forward controller. Since the circuit performs control for only optical output fluctuation conditions set in advance, it cannot control the optical output from the laser diode in correspondence with optical output fluctuation conditions other than ambient temperature fluctuations. For this reason, e.g., when the laser diode deteriorates with time to decrease the optical output, the optical output may be smaller than its lower limit defined in the optical transmission system.

In the laser diode driving circuit, light emission may delay, the extinction ratio may decrease, and the quality of the transmission system may degrade because no consideration is given to temperature fluctuations in differential quantum efficiency of the laser diode. That is, the optical output is controlled at a constant level by changing only the bias current without changing the driving current in correspondence with the ambient temperature.

FIGS. 1A and 1B show the current vs. optical output characteristics of a general laser diode. FIG. 1A shows current vs. optical output characteristics when the bias current and the driving current are ideally distributed. FIG. 1B shows current vs. optical output characteristics when the driving current is kept constant.

In FIGS. 1A and 1B, t1, t2, and t3 (t1<t2<t3) represent ambient temperatures; Isn, Idn, and Ithn (n=1, 2, 3), the bias current, the driving current, and the light emission threshold current of the laser diode; and Po, the optical output. The laser diode driving circuit controls the optical output Po at a constant level at the respective temperatures. The laser diode has such a characteristic that both the bias current Is and driving current Id required to obtain a constant optical output Po increase along with an increase in ambient temperature. As shown in FIG. 1A, it is ideal for efficiently driving the laser diode that the bias current Is is set about the light emission threshold current Ith of the laser diode, and the driving current Id is superposed on the bias current Is to keep the optical output constant.

In the laser diode driving circuit in FIG. 5 for controlling the optical output at a constant level by changing the bias current Is while keeping the driving current Id constant, if the bias current Is2 and the driving current Id2 are optimum at an ambient temperature t2, but the ambient temperature decreases to t1, the set value Is1 of the bias current becomes smaller than the light emission threshold current Ith1 to delay light emission. If the ambient temperature increases from t2 to t3, the set value Is3 of the bias current exceeds the light emission threshold current Ith3 to decrease the extinction ratio, failing to obtain a reliable extinction state.

SUMMARY OF THE INVENTION

It is an object of the present invention to provide a laser diode driving method and circuit capable of controlling an optical output and extinction ratio at a constant level against an optical output fluctuation factor such as deterioration of the laser diode with time that cannot be set in advance.

It is another object of the present invention to provide a laser diode driving method and circuit capable of controlling the optical output and extinction ratio of the laser diode at a constant level regardless of the ambient temperature.

To achieve the above objects, there is provided a laser diode driving method comprising the steps of adjusting, in accordance with an ambient temperature, a bias current set about a light emission threshold current of a laser diode, and a pulse current for causing the laser diode to emit light, and driving the laser diode by a current prepared by superposing the bias current and the pulse current, thereby controlling an optical output and extinction ratio of the laser diode at a constant level.

DESCRIPTION OF THE PREFERRED EMBODIMENTS

Figure 1A:
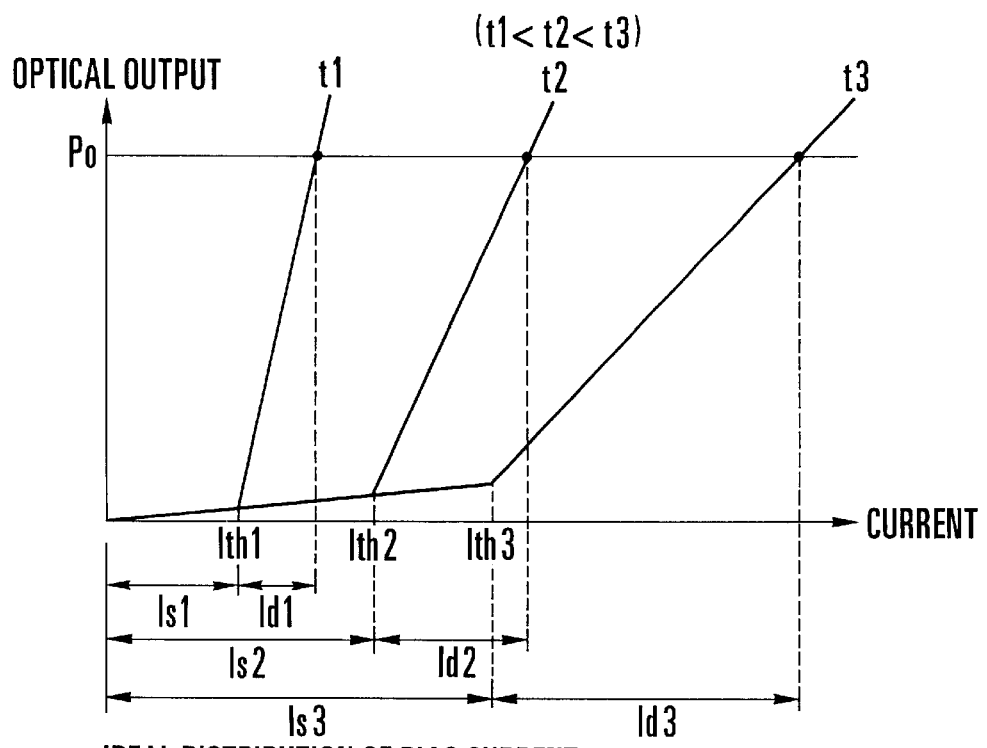
FIGS. 1A and 1B are graphs each showing the current vs. optical output characteristics of a laser diode.
Figure 1B:
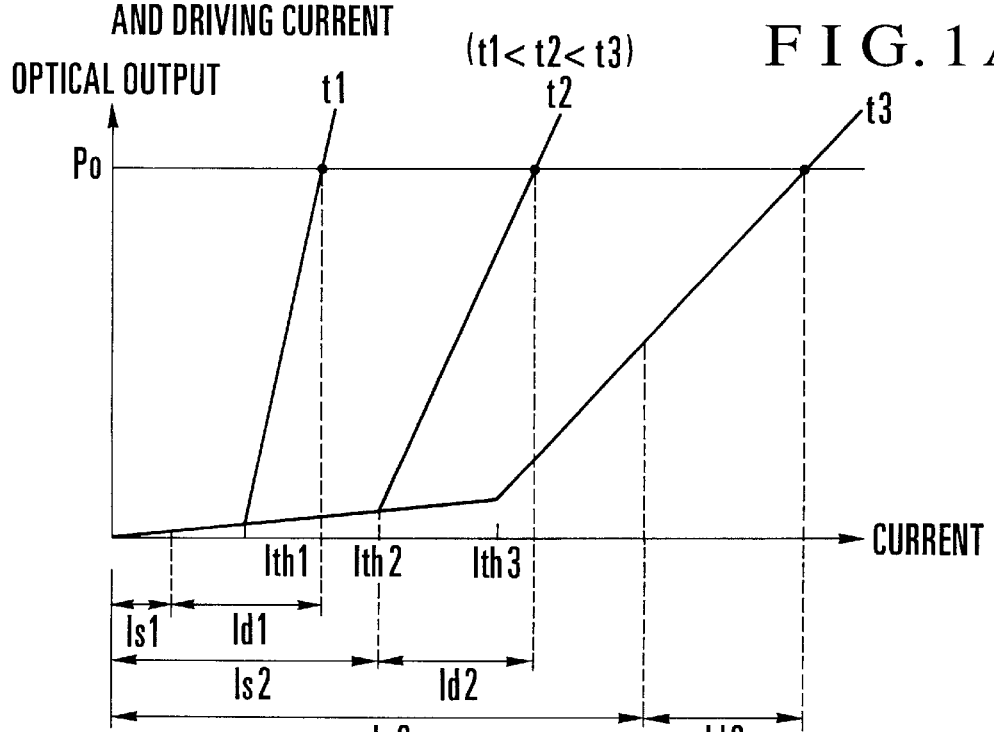
Figure 2:
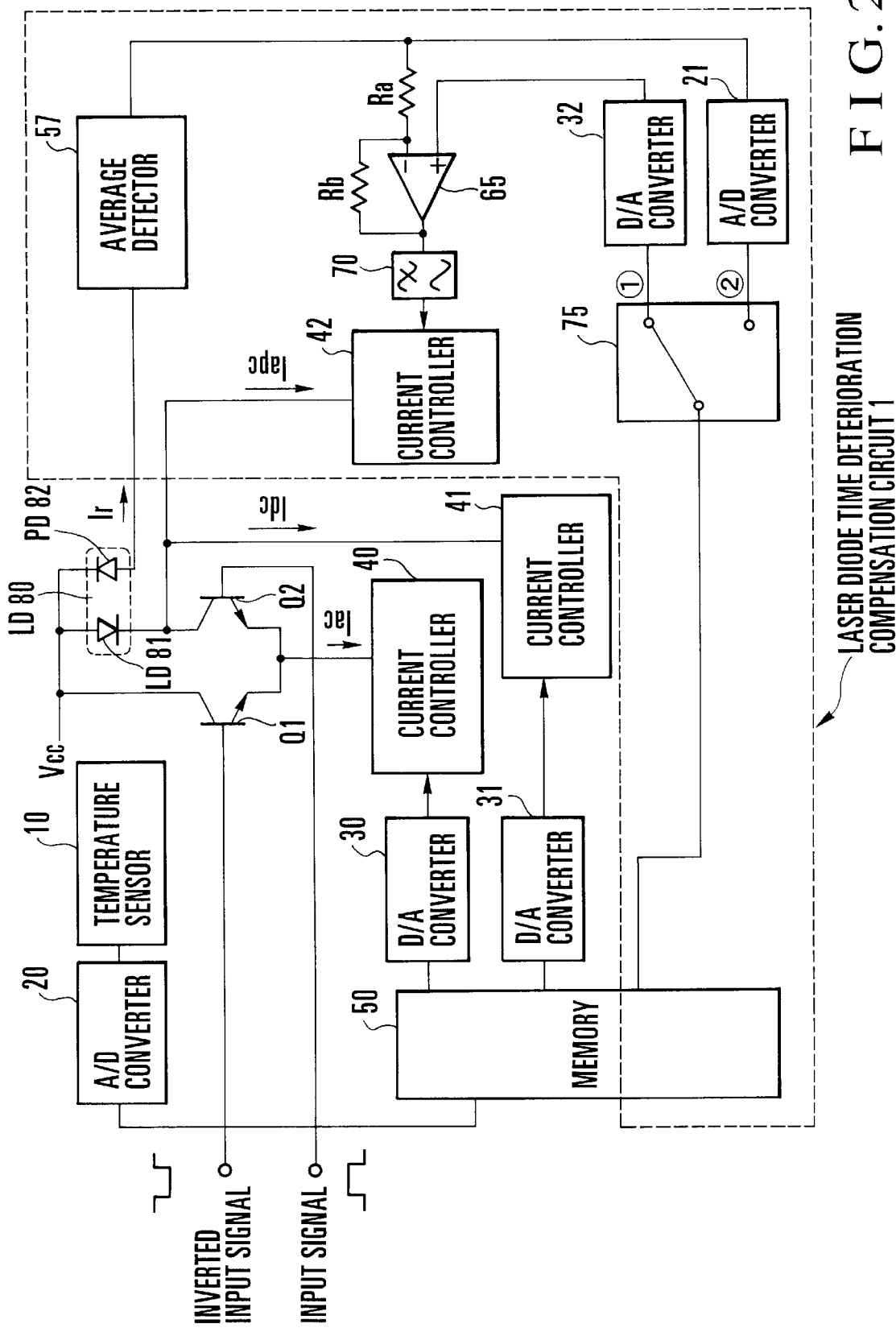
FIG. 2 is a block diagram showing the arrangement of a laser diode driving circuit according to the first embodiment of the present invention.

Embodiments of the present invention will be described in detail below with reference to the accompanying drawings.
First Embodiment FIG. 2 shows the arrangement of a laser diode driving circuit according to the first embodiment of the present invention. The laser diode driving circuit of the first embodiment comprises a temperature sensor 10, A/D converters 20 and 21, D/A converters 30 to 32, current controllers 40 to 42, a memory 50, an average detector 57, an inverting amplifier 65, a low-pass filter (LPF) 70, a switch 75, an LD module 80 constituted by a laser diode 81 and a monitor photodiode (to be referred to as a monitor PD hereinafter) 82 for detecting the optical output from the laser diode 81, and transistors Q1 and Q2.

In the laser diode driving circuit, the A/D converter 21, the D/A converter 32, the current controller 42, the memory 50, the average detector 57, the inverting amplifier 65, the LPF 70, and the switch 75 constitute a laser diode time deterioration compensation circuit 1. The average detector 57, the inverting amplifier 65, and the LPF 70 constitute a time deterioration state detection means.

The laser diode 81 and monitor PD 82 constituting the LD module 80 are formed on the same substrate by the same process.

The temperature sensor 10 generates a voltage in correspondence with the ambient temperature and outputs the voltage as a temperature signal to the A/D converter 20. The A/D converter 20 A/D-converts the temperature signal and outputs the analog signal as an address to the memory 50.

Data about the pulse current, the bias current, and a light-receiving current Ir of the monitor PD 82 before deterioration is stored in the memory 50 at each address corresponding to the ambient temperature. The values of the pulse current and bias current stored in the memory 50 are determined to keep the optical output and extinction ratio of the laser diode 81 constant against fluctuations in ambient temperature.

The memory 50 outputs pulse current data and bias current data stored at the address designated by the A/D converter 20 to the D/A converters 30 and 31, respectively. The D/A converters 30 and 31 respectively D/A-convert the digital data output from the memory 50 and output the analog signals to the current controllers 40 and 41.

The current controller 40 adjusts a constant current Iac common to the transistors Q1 and Q2 in accordance with the analog signal from the D/A converter 30. The current controller 41 adjusts a constant current Idc in accordance with the analog signal from the D/A converter 31.

The detailed arrangement of the laser diode time deterioration compensation circuit 1 will be explained. The light-receiving current Ir of the monitor PD 82 is input to the average detector 57. The average detector 57 detects the average of the light-receiving current Ir, converts it into a voltage signal, and outputs the voltage signal to the A/D converter 21 and the inverting input terminal of the inverting amplifier 65.

The A/D converter 21 A/D-converts the input voltage from the average detector 57. The data digitally converted by the A/D converter 21 is output to the memory 50 via the switch 75.

In the memory 50, the data input from the A/D converter 21 is stored at an address corresponding to the temperature detected by the temperature sensor 10. This data serves as a reference voltage in compensating the optical output upon deterioration of the laser diode.

The memory 50 outputs the reference voltage data to the D/A converter 32 via the switch 75. The D/A converter 32 D/A-converts the data and outputs the analog signal to the non-inverting input terminal of the inverting amplifier 65.

The inverting amplifier 65 uses the voltage input from the D/A converter 32 to the non-inverting input terminal as a reference voltage to invert and amplify the voltage input from the average detector 57 to the inverting input terminal and output the voltage to the LPF 70.

The LPF 70 smoothes the inverted/amplified voltage and outputs the resultant voltage to the current controller 42. The current controller 42 adjusts a constant current Iapc in accordance with the output signal from the LPF 70.

The operation of the laser diode driving circuit according to the first embodiment will be explained with reference to a numerical example.

The temperature sensor 10 detects an ambient temperature of −40 to +115° C., converts the detected temperature into a voltage of 0 to 2 V, and outputs the voltage. The A/D converter 20 converts the voltage output from the temperature sensor 10 into 7-bit digital data and outputs the data as an address to the memory 50.

The memory 50 outputs to the D/A converter 30 7-bit pulse current data stored at an address output from the A/D converter 20, and outputs to the D/A converter 31 5-bit bias current data stored at the same address.

The D/A converter 30 D/A-converts the input digital data and outputs the analog signal to the current controller 40. Similarly, the D/A converter 31 D/A-converts the input digital data and outputs the analog signal to the current controller 41.

The current controller 40 adjusts the constant current Iac common to the transistors Q1 and Q2 between 0 mA and 70 mA in accordance with the analog signal from the D/A converter 30.

An input signal to the base of the transistor Q2 is a signal based on transmission data, and an inverted input signal to the base of the transistor Q1 is a signal obtained by inverting the input signal.

When the input signal is at high level, the transistor Q2 is turned on, the transistor Q1 is turned off, and the constant current Iac flows through the laser diode 81. When the input signal is at low level, the transistor Q1 is turned on, the transistor Q2 is turned off, and no constant current Iac flows through the laser diode 81. That is, the constant current Iac drives the laser diode 81 as a pulse current based on transmission data.

The current controller 41 adjusts the constant current Idc between 0 mA and 50 mA in accordance with the analog signal from the D/A converter 31. The constant current Idc directly flows through the laser diode 81 and drives it as a bias current.

The operation of the laser diode time deterioration compensation circuit 1 will be explained. The light-receiving current Ir of the monitor PD 82 is input to the average detector 57. The average detector 57 detects the average of the light-receiving current Ir, converts it into a voltage of 0 to 550 mV, and outputs the voltage to the A/D converter 21 and the inverting input terminal of the inverting amplifier 65.

The A/D converter 21 converts the voltage output from the average detector 57 into 5-bit digital data. The data digitally converted by the A/D converter 21 is output to the memory 50 via the switch 75.

In the memory 50, the data input from the A/D converter 21 is stored at an address corresponding to the temperature detected by the temperature sensor 10. This data is used as an initial output value of the monitor PD, i.e., reference voltage data before deterioration of the laser diode 81.

The memory 50 outputs the reference voltage data to the D/A converter 32 via the switch 75. The D/A converter 32 converts the reference voltage data into a voltage of 0 to 550 mV and outputs the voltage to the non-inverting input terminal of the inverting amplifier 65.

The switch 75 connects either the A/D converter 21 or the D/A converter 32 to the memory 50. The switch 75 switches to the A/D converter 21 side (②) in writing the reference voltage data in the memory 50, and to the D/A converter 32 side (⓪) in reading out the reference voltage data from the memory 50.

The inverting amplifier 65 uses the voltage input from the D/A converter 32 to the non-inverting input terminal as a reference voltage to invert and amplify the voltage input from the average detector 57 to the inverting input terminal and output the voltage to the LPF 70.

The LPF 70 smoothes the inverted/amplified voltage and outputs the resultant voltage to the current controller 42. The current controller 42 adjusts the constant current Iapc between 0 mA and 30 mA in accordance with the output signal from the LPF 70. The constant current Iapc directly flows through the laser diode 81 and drives it as a bias current, similarly to the constant current Idc. That is, the current controller 42 adjusts the constant current Iapc in correspondence with a decrease in light-receiving current Ir of the monitor PD 82 caused by deterioration of the laser diode 81 over time. A decrease in bias current caused by deterioration of the laser diode 81 over time is compensated up to 30 mA by the constant current Iapc.

According to the first embodiment, the optical output fluctuating upon deterioration of the laser diode 81 over time is controlled at a constant level. More specifically, data about the light-receiving current Ir of the monitor PD 82 when the laser diode 81 before deterioration outputs a desired light power is stored in the memory 50 for each temperature. The initial data stored in the memory 50 is used as a reference value. A decrease in light-receiving current Ir of the monitor PD 82 is detected as a decrease in optical output from the laser diode 81 on the basis of the reference value, and feedback control for increasing the bias current is performed. Accordingly, the optical output can be compensated by an amount corresponding to deterioration of the laser diode 81, and the optical output can be controlled at a constant level.

The measured data of the light-receiving current Ir is used as a reference value, which includes variations in an individual laser diode and another device. Therefore, the optical output and the extinction ratio can be controlled without any special adjustment for the time deterioration compensation circuit 1.

Not only the bias current but also the pulse current can be independently controlled in correspondence with the ambient temperature. More specifically, the bias current and the pulse current are stored in the memory 50 at an address corresponding to the ambient temperature. The bias current and pulse current corresponding to the ambient temperature drive the laser diode 81. In this case, since the bias current and the pulse current can be independently controlled, not only the optical output but also the extinction ratio can be controlled at a constant level in correspondence with the ambient temperature by storing the bias current and the pulse current in the memory 50 in accordance with the current vs. optical output characteristics of each laser diode 81 for each temperature. As a result, the laser diode driving circuit can drive the laser diode suitably for the transmission system without any light emission delay and any failure to obtain a reliable extinction state due to a decrease in extinction ratio.

Second Embodiment

The second embodiment of the present invention will be described below with reference to FIG. 3.

Figure 3:
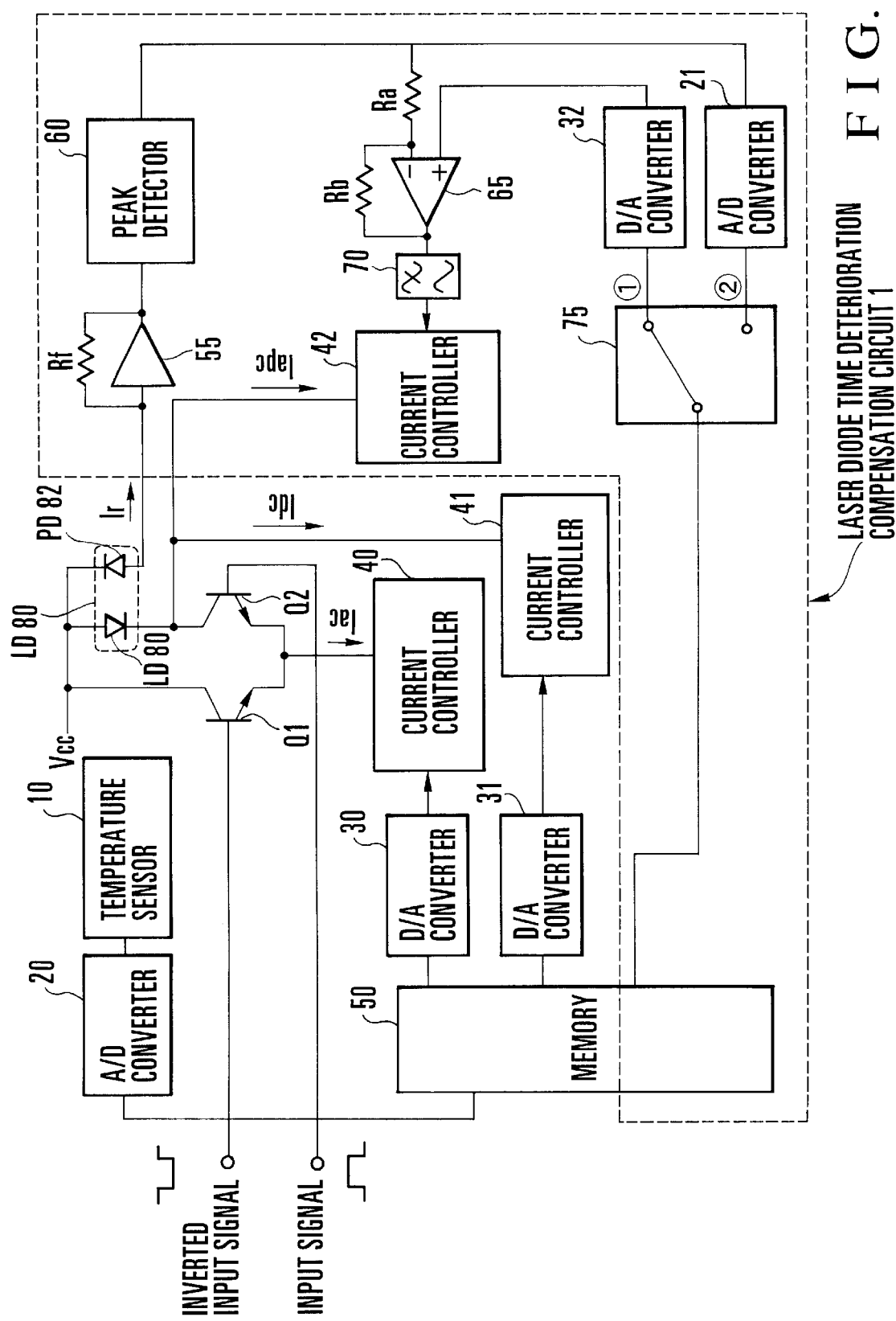
FIG. 3 is a block diagram showing the arrangement of a laser diode driving circuit according to the second embodiment of the present invention.

FIG. 3 shows the arrangement of a laser diode driving circuit according to the second embodiment of the present invention. The laser diode driving circuit of the second embodiment comprises a preamplifier 55 and a peak detector 60 instead of the average detector 57 in the first embodiment shown in FIG. 2. Since the remaining arrangement is the same as in the first embodiment shown in FIG. 2, the same reference numerals as in FIG. 2 denote the same parts, and a description thereof will be omitted.

A light-receiving current Ir of a monitor PD 82 is input to the preamplifier 55 and converted into a voltage signal. The voltage signal is output to the peak detector 60. The peak detector 60 detects the peak voltage of the voltage signal output from the preamplifier 55, and outputs the detection voltage to an A/D converter 21 and the inverting input terminal of an inverting amplifier 65. The remaining operation is the same as in the first embodiment.

In the first embodiment, deterioration of the laser diode 81 over time is compensated based on the average of the light-receiving current Ir of the monitor PD 82. In the second embodiment, deterioration of the laser diode 81 over time is compensated based on the peak value of the light-receiving current Ir of the monitor PD 82.

In the first embodiment, when a burst signal is used as transmission data, the average of the light-receiving current Ir of the monitor PD 82 is very low, and fluctuations in light-receiving current Ir of the monitor PD 82 are difficult to detect. For this reason, deterioration of the laser diode 81 cannot be determined.

In the second embodiment, however, since the peak value of the light-receiving current Ir of the monitor PD 82 is detected, even if a burst signal is used as transmission data, deterioration of the laser diode 81 over time can be determined, and a decrease in optical output can be compensated in correspondence with a decrease in peak value.

Third Embodiment

The third embodiment of the present invention will be described with reference to FIG. 4.

Figure 4:
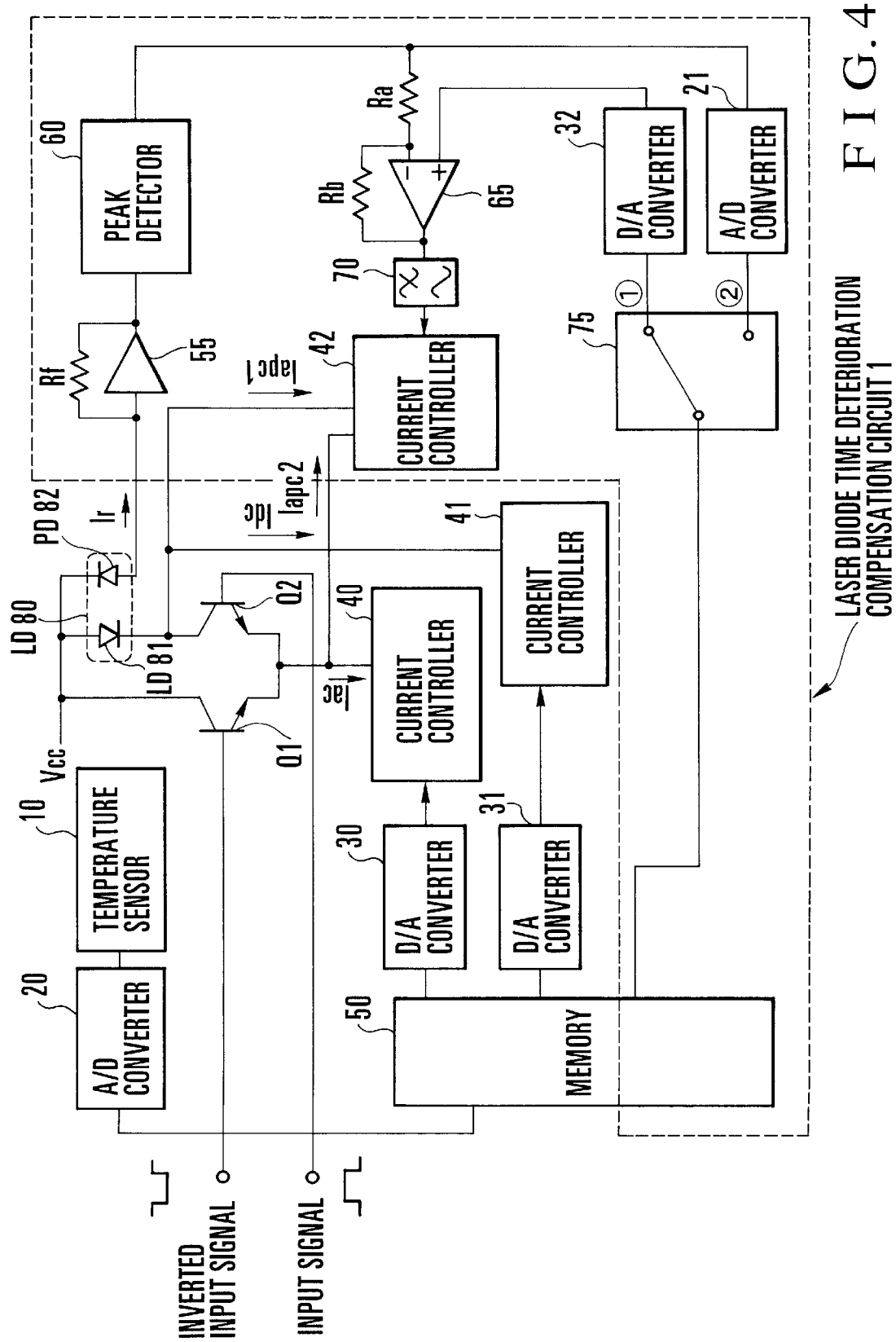
FIG. 4 is a block diagram showing the arrangement of a laser diode driving circuit according to the third embodiment of the present invention.
Figure 5:
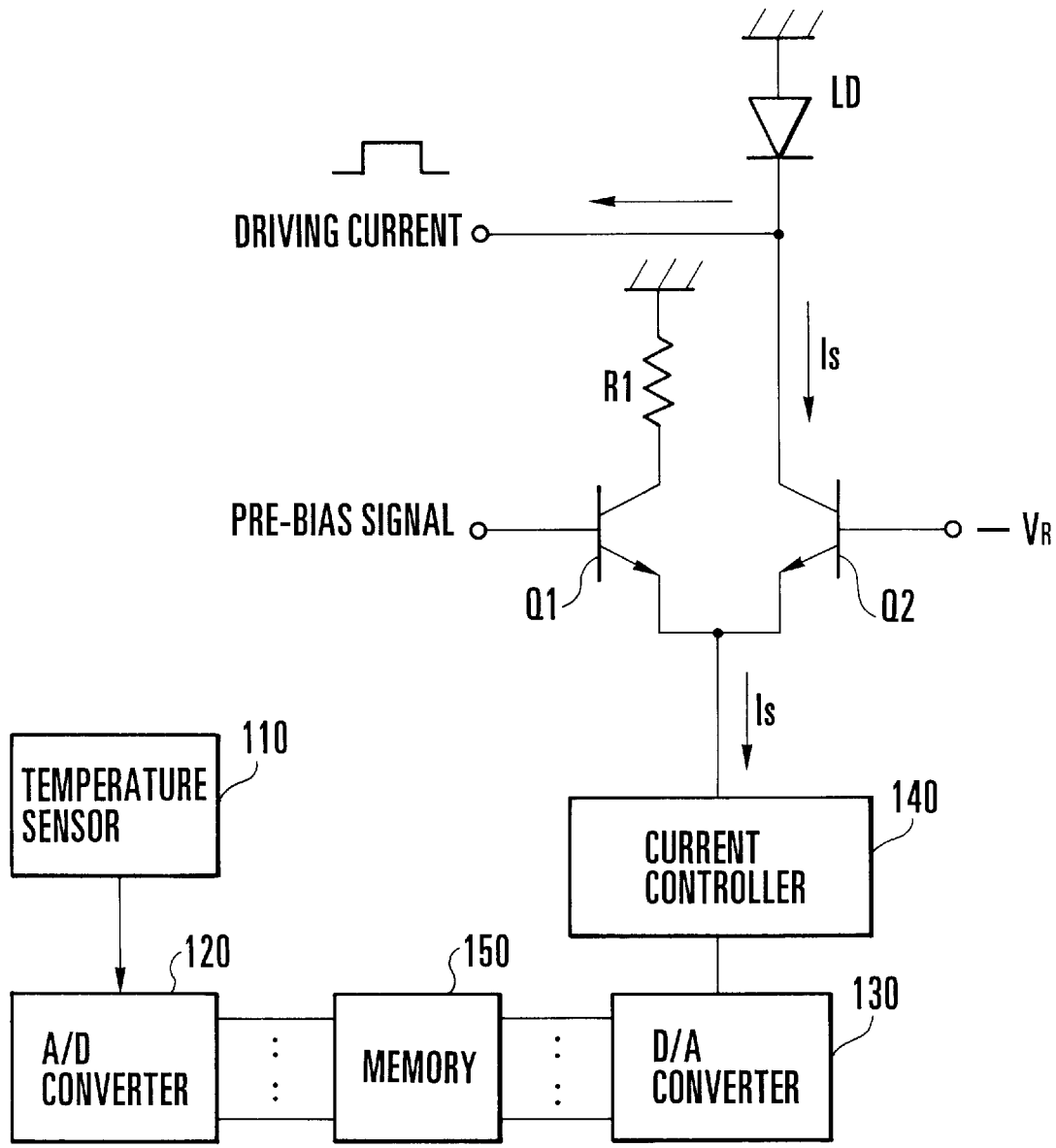
FIG. 5 is a block diagram showing the arrangement of a conventional laser diode driving circuit.

FIG. 4 shows the arrangement of a laser diode driving circuit according to the third embodiment of the present invention. The laser diode driving circuit of the third embodiment has the same constituent elements as in the second embodiment shown in FIG. 3 except that a current controller 42 controls two different constant currents, i.e., a constant current Iapc1 and a constant current Iapc2. Since the remaining arrangement is the same as in the second embodiment shown in FIG. 3, the same reference numerals as in FIG. 3 denote the same parts, and a description thereof will be omitted.

The constant current Iapc1 serves as a bias current directly flowing through a laser diode 81, whereas the constant current Iapc2 serves as a pulse current controlled by an input signal.

More specifically, in the third embodiment, both the bias current and the pulse current are compensated in accordance with deterioration of the laser diode 81 over time. The optical output and the extinction ratio can be controlled at a constant level in correspondence with deterioration of the laser diode 81 over time.

Fourth Embodiment

The third embodiment adopts the preamplifier 55 and the peak detector 60. However, in the arrangement of the third embodiment shown in FIG. 4, an average detector 57 may replace the preamplifier 55 and the peak detector 60, and deterioration of a laser diode 81 over time may be compensated based on the average of the light-receiving current Ir of a monitor PD 82, similarly to the first embodiment.

What is claimed is:

1. A laser diode driving method, comprising the steps of:
    storing bias current and pulse current values for a laser diode at a plurality of temperatures, said values selected to maintain a constant optical output and extinction ratio of said laser diode at each of said temperatures;
    detecting an ambient temperature;
    adjusting, in accordance with an automatic power control circuit, a bias current set about a light emission threshold current of said laser diode, and a pulse current for causing the laser diode to emit light, said adjusting step including determining said bias current and said pulse current based on the bias current and pulse current values stored in said memory at said detected ambient temperature; and
    driving the laser diode by a current prepared by superposing the bias current and the pulse current, thereby controlling an optical output and extinction ratio of the laser diode at a constant level.

2. A laser diode driving method comprising the steps of:
    adjusting, in accordance with an ambient temperature, a bias current set about a light emission threshold current of a laser diode, and a pulse current for causing the laser diode to emit light;
    adjusting the bias current in accordance with a deterioration state of the laser diode over time, said bias-current adjusting step including:
    a) a storing, in correspondence with ambient temperatures, initial output values of a monitor photodiode for detecting the optical output of the laser diode,
    b) obtaining an initial output value corresponding to a current ambient temperature from the stored output values,
    c) comparing the initial output value with a current output value of the monitor photodiode, and
    d) confirming the deterioration state of the laser diode over time based on said comparing step; and
    driving the laser diode by a current prepared by superposing the bias current and the pulse current, said superposed current controlling an optical output of the laser diode at a constant level.

3. A method according to claim 2, wherein the deterioration state of the laser diode over time is confirmed using an average of outputs of a monitor photodiode for detecting the optical output of the laser diode.

4. A method according to claim 2, wherein the deterioration state of the laser diode with time is confirmed using a peak value of outputs of a monitor photodiode for detecting the optical output of the laser diode.

5. A laser diode driving method comprising the steps of:
    adjusting, in accordance with ambient temperature and a deterioration state of a laser diode over time, a bias current set about a light emission threshold current of the laser diode, and pulse current for causing the laser diode to emit light, said bias-current adjusting step including:
    storing, in correspondence with ambient temperatures, initial output values of a monitor photodiode for detecting the optical output of the laser diode,
    b) obtaining an initial output value corresponding to a current ambient temperature from the stored output values,
    c) comparing the initial output value with a current output value of the monitor photodiode, and
    d) confirming the deterioration state of the laser diode over time based on said comparing step; and
    driving the laser diode by a current prepared by superposing the bias current and the pulse current, said superposed current controlling an optical output and extinction ratio of the laser diode at a constant level.

6. A method according to claim 5, wherein the deterioration state of the laser diode with time is confirmed using an average of outputs of a monitor photodiode for detecting the optical output of the laser diode.

7. A method according to claim 5, wherein the deterioration state of the laser diode with time is confirmed using a peak value of outputs of a monitor photodiode for detecting the optical output of the laser diode.

8. A laser diode driving circuit comprising:
    a laser diode;
    a temperature sensor for detecting an ambient temperature;
    memory means for storing, in correspondence with ambient temperatures, bias current values set about a light emission threshold current of said laser diode, and pulse current values for causing said laser diode to emit light, and outputting a bias current value and pulse current value corresponding to an ambient temperature detected by said temperature sensor; and
    current control means for determining a bias current and pulse current for said laser diode on the basis of the values output from said memory means, said current control means including an automatic power control circuit for driving said laser diode by a current prepared by superposing the bias current and the pulse current.

9. A laser diode driving circuit comprising:
    a laser diode;
    a temperature sensor for detecting an ambient temperature;

a monitor photodiode for detecting an optical output of said laser diode;

memory means for storing, in correspondence with ambient temperatures, bias current values set about a light emission threshold current of said laser diode, pulse current values for causing said laser diode to emit light, and initial output values of said monitor photodiodes, and outputting a bias current value, pulse current value, and initial output value of said monitor photodiode corresponding to an ambient temperature detected by said temperature sensor;

time deterioration state detection means for comparing the initial output value of said monitor photodiode output from said memory means with a current output value, and generating a signal representing a deterioration state of said laser diode over time; and current control means for determining a pulse current for said laser diode on the basis of the pulse current value output from said memory means, determining a bias current for said laser diode on the basis of the bias current value output from said memory means and the signal representing the deterioration state over time output from said time deterioration state detection means, and driving said laser diode by a current prepared by superposing the bias current and the pulse current.

10. A circuit according to claim 9, wherein said memory means stores an average of the initial outputs of said monitor photodiode, and said time deterioration state detection means comprises an average detector for detecting an average of current outputs of said monitor photodiode.

11. A circuit according to claim 9, wherein said memory means stores a peak value of the initial outputs of said monitor photodiode, and said time deterioration state detection means comprises a peak detector for detecting a peak value of current outputs of said monitor photodiode.

12. A laser diode driving circuit comprising:

a laser diode;

a temperature sensor for detecting an ambient temperature;

a monitor photodiode for detecting an optical output of said laser diode;

memory means for storing, in correspondence with ambient temperatures, bias current values set about a light emission threshold current of said laser diode, pulse current values for causing said laser diode to emit light, and initial output values of said monitor photodiodes, and outputting a bias current value, pulse current value, and initial output value of said monitor photodiode corresponding to an ambient temperature detected by said temperature sensor;

time deterioration state detection means for comparing the initial output value of said monitor photodiode output from said memory means with a current output value, and generating a signal representing a deterioration state of said laser diode over time; and current control means for determining a bias current and pulse current for said laser diode on the basis of the bias current value and pulse current value output from said memory means and the signal representing the deterioration state over time output from said time deterioration state detection means, and driving said laser diode by a current prepared by superposing the bias current and the pulse current.

13. A circuit according to claim 12, wherein said memory means stores an average of the initial outputs of said monitor photodiode, and said time deterioration state detection means comprises an average detector for detecting an average of current outputs of said monitor photodiode.

14. A circuit according to claim 12, wherein said memory means stores a peak value of the initial outputs of said monitor photodiode, and said time deterioration state detection means comprises a peak detector for detecting a peak value of current outputs of said monitor photodiode.

* * * * *